United States Patent
Farlow

[11] Patent Number: 6,164,634
[45] Date of Patent: Dec. 26, 2000

[54] ADJUSTABLE TOOLING PINS

[76] Inventor: Douglas T. Farlow, 11873 Calle Parral, San Diego, Calif. 92128

[21] Appl. No.: 09/359,720

[22] Filed: Jul. 23, 1999

[51] Int. Cl.[7] ...................................................... B23Q 1/00
[52] U.S. Cl. ............................. 269/47; 269/48.1; 269/903
[58] Field of Search ............................. 269/47, 48.1, 903

[56] References Cited

U.S. PATENT DOCUMENTS

| | | | |
|---|---|---|---|
| 761,523 | 5/1904 | Miller | 269/47 |
| 762,060 | 6/1904 | Huhn | 269/47 |
| 2,186,198 | 1/1940 | Krumbach | 269/47 |
| 3,462,050 | 8/1969 | Hensley | 269/48.1 |
| 4,805,316 | 2/1989 | Curti | 269/903 |
| 5,005,814 | 4/1991 | Gumbert | 269/903 |
| 5,401,010 | 3/1995 | Haswell et al. | 269/903 |
| 5,566,840 | 10/1996 | Waldner et al. | 269/903 |
| 5,785,307 | 7/1998 | Chung | 269/903 |

*Primary Examiner*—Robert C. Watson
*Attorney, Agent, or Firm*—Donn K. Harms

[57] ABSTRACT

An adjustable tooling pin assembly for precisely positioning printed circuit boards having different diameter and spacing of tooling alignment holes with different series of boards. Two support bodies are positioned along a base at the approximate location of spaced tooling holes. One support body carries an upwardly extending tooling pin with a diameter smaller than the tooling hole. The other support body carries two upwardly extending, adjacent, thin tooling pins, one of which is fixed to the support body and the other fastened to a block slidable in a channel in the support body, to move the movable pin relative to the fixed pin. The board holes are placed over the pins, the support bodies are secured to the base with the outermost tooling pins engaging the outer hole edges. The movable pin is moved away from the adjacent fixed pin by rotating a threaded rod extending though the support block to move the movable pin into contact with the tool hole edge opposite the fixed pin edge. The movable pin is secured against further movement by a setscrew. Desired operations, such as placement of electronic components on the board, are conducted, then the board is removed. The board is removed and replaced by a series of boards having the same tooling holes for further operations.

10 Claims, 1 Drawing Sheet

U.S. Patent     Dec. 26, 2000     6,164,634

ADJUSTABLE TOOLING PINS

FIELD OF THE INVENTION

This invention relates to adjustable pins for locating preforms such as printed circuit boards and the like at precise positions relative to apparatus for performing precisely located operations thereon.

BACKGROUND OF THE INVENTION

Often very precisely located operations must be performed on preforms. The preform must be exactly positioned relative to the apparatus so that all operations will be performed at the required position. Typical of these are locating metal preforms relative to numerical controlled precision machining devices, locating sheets of material relative to apparatus for punching patterns of holes in the sheets and positioning printed circuit boards relative to devices for installing very small parts very close together across the board surface.

Printed circuit boards normally have two tooling holes near one edge, with the distance between hole centerlines and hole diameters being exactly the same in a series of boards to be processed. The apparatus for performing operations on the boards, such as printing circuit patterns, punching holes for insertion of components, placing electronic components accurately relative to printed circuit patterns, etc. have two pins having diameters and spacing conforming to the tooling pin holes. The tooling pins are mounted on blocks to form tooling pin assemblies that can be fastened to a base, such as plates or rails at appropriate locations to support and align particular printed circuit boards.

In a typical printed circuit board printing process or component placement process, a series of identical boards are processed, then the apparatus is switched over to another series of different boards. While all boards in a series to undergo the same operation will have uniform pin spacing and diameter, boards in different series will generally have different spacing and diameter dimensions, since the boards will have different overall dimensions. In order to allow the apparatus to accommodate these different boards, the tooling pins are mounted on blocks or the like that can be removed from the apparatus and replaced with different blocks having different pin diameters and the replacement blocks will be secured to the apparatus at desired locations along a base or rails resulting in inaccurate positioning of components.

Because of the wide variety of tooling pin hole diameters used with different printed circuit boards, an inventory of a great number of precise, expensive, tooling pin assemblies must be maintained. While a machine is being set up for a particular series of boards, errors can be easily made in selecting tooling pin assemblies, resulting in pins too large or too small to exactly fit in the printed circuit board tooling holes. It is critical that the pins exactly fit the corresponding holes to assure accurate alignment. Where pins are too large, the board will not fit over them, with forcing resulting in damage to the board. If the pins are too small and the discrepancy is not noticed, succeeding boards will shift and not be positioned identically. Once the error in pin selection is noticed, the setup will need to be redone.

Where the printed circuit boards are manufactured in different batches, holes of different diameters may be used with different batches, requiring removal, replacement and realignment of the tooling pins between batches.

Attempt have been made to provide locator pins including means for assuring accurate engagement of tooling pins with printed circuit board tooling holes to accommodate slightly over size holes.

Typically of these is the apparatus described by Silverman in U.S. Pat. No. 4,244,109 in which one pin is cylindrical for engaging a cylindrical hole and the other is frusto-conical for engaging a tapered hole. As the tapered hole is forced over the conical pin, the board is forced toward the cylindrical pin. While this should assure contact with the cylindrical pin, the tapered hole is difficult to accurately manufacture and may be damaged as it is forced over the conical pin. Also, subsequent processing of the board on other devices having conventional cylindrical holes will not be possible.

Rich, in U.S. Pat. No. 3,957,371, describes a locating pin arrangement using one cylindrical pin and an expandable pin cooperating with two tooling hole in a printed circuit board. The expanding pin includes a tapered central shave and a segmented outer sleeve which expands when forced along the tapered core. This is a complex pin arrangement that can accommodate a slightly oversize hole but not holes of significant diameter difference. Rather than providing a way of using one pin assembly with holes of significantly varying diameters, the Rich assembly basically merely assures tight contact between pin and hole.

Therefore, there is a continuing need for locating pin assemblies for use with printed circuit boards and other preforms that utilize two spaced alignment holes that can accommodate significantly different diameter holes, is simple, reliable and inexpensive, does not require removal and replacement when different printed circuit boards or different series of boards having tooling holes of different diameters are to be processed and eliminates the necessity of providing a large inventory of tooling pin assemblies with a wide variety of tooling pin diameter.

SUMMARY OF THE INVENTION

The above-noted problems, and others, are overcome in accordance with this invention by adjustable tooling pin assemblies that, basically, comprise a tooling pin support body, at least two tooling pin having a predetermined diameter secured to a first surface of said block, and means for moving at least one tooling pin relative to the other tooling pin. The support body is secured to a mounting rail or the like on a machine for performing operations on an object, such as a PCB, upon which operations, such as printing a circuit, placing electronic components, etc. are to be performed.

These adjacent tooling pins collectively have a diameter considerably less than the typical PCB tooling hole, so that they may be inserted as a group into such a tooling hole and moved apart to engage the sides of the tooling hole. Then, the pins are locked in place and the support is secured to the mounting rail. Succeeding PCB's can be placed over the pins and be positioned exactly in the same position as the first PCB.

In a preferred embodiment, a channel is provided in a second surface of the support body opposite the first surface, with a tooling pin block slidable along said channel. A slot extends from the channel to the first surface of the support body adjacent to the first tooling pin. The second tooling pin is secured to the tooling pin block for movement toward and away from the first tooling pin. A screw is provided for moving the tooling pin block to bring both tooling pins into contact with the opposite edges of the PCB tooling hole. A setscrew then locks the tooling pin block in place while operations are performed on a series of PCB's having identical tooling holes.

The movable tooling pin allows the support block to accommodate a wide variety of PCB tooling pin hole diameters. Generally, a second tooling pin hole is provided in the PCB. A second tooling pin (of a diameter less than the smallest of the different PCB hole diameters that are to be accommodated) is secured to the mounting rail. In use, a tooling hole in the PCB is placed over the second tooling pin, the adjustable tooling pin block is secured to the rail with the second, fixed pin positioned so that the second pin and fixed pin engage opposite sides of their respective tooling holes and the movable tooling pin is moved into engagement with the edge of the tooling hole opposite the fixed pin and locked in place. Additional PCB's in that series can be sequentially placed over the tooling pins which will assure accurate, reproducible, alignment.

Where there are two (or more) tooling holes, a movable pin assembly as described may be provided to engage each tooling hole. Or, if desired, some tooling holes may be engaged by fixed pins and others by moveable pins. Further, if desired, more than one movable pin may be provided at each tooling hole, with more than one assembly of slot, pin and drive screw arranged at angles to each other at different depths in the support body.

BRIEF DESCRIPTION OF THE DRAWING

Details of the invention, and of preferred embodiments thereof, will be further understood upon reference to the drawing, wherein.

DETAILED DESCRIPTION OF PREFERRED EMBODIMENTS

Figure 1:
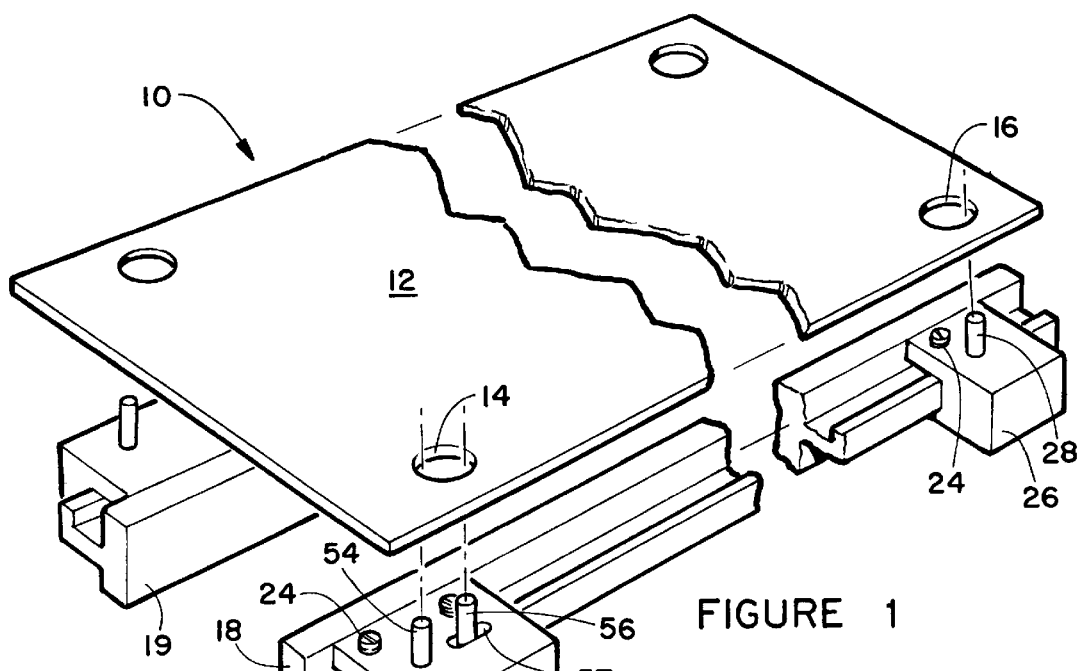
FIG. 1 is a perspective view of the apparatus for aligning tooling pins with tooling holes in a PCB.

As seen in FIG. 1, assembly 10 includes a printed circuit board (PCB) 12 having tooling holes 14 and 16 for use in aligning the PCB with a conventional machine (not shown) for performing an operation on the board, such as stenciling a conductor pattern, applying flux, placing electronic components, etc.

A rail 18 (or platen, if desired) is provided adjacent to PCB 12 to which first and second support bodies 20 and 26 are affixed. A generally L-shaped ridge 17 extends along a front edge of rail 18. A channel 22 in the back of each of support bodies 20 and 26 fits over ridge 17. A pair of setscrews 24 extend though the top portion of each support body adjacent to slot 21 to engage ridge 17 and hold the support body in a selected position. Any other suitable means for securing support bodies 20 and 26 to rail 18 may be used. Second tooling pin support body 26 is secured to rail 18 adjacent to second tooling hole 16. A second rail 19 supports the back portion of PCB 12.

A fixed tooling pin 28, having a diameter less than or equal to the diameter of tooling hole 15 is mounted on second tooling pin support body 26.

Figures 2, 7:
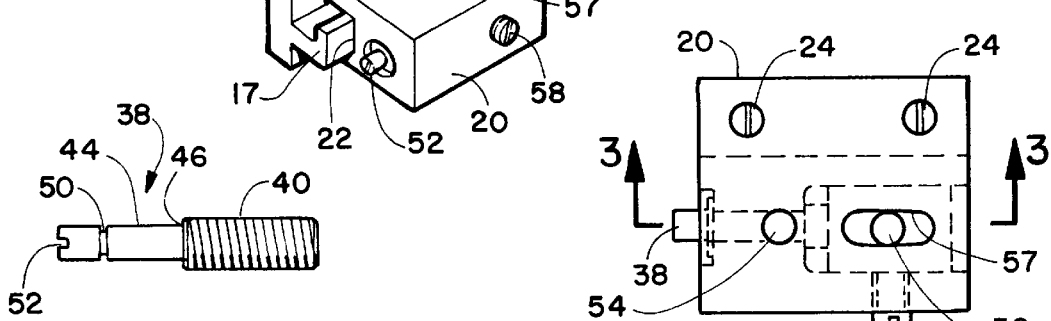
FIG. 2 is a plan view, partially cut-away, of the tooling pin assembly of this invention.
FIG. 7 is a detail view of the rod for moving the tooling pin block.
Figures 3, 4:
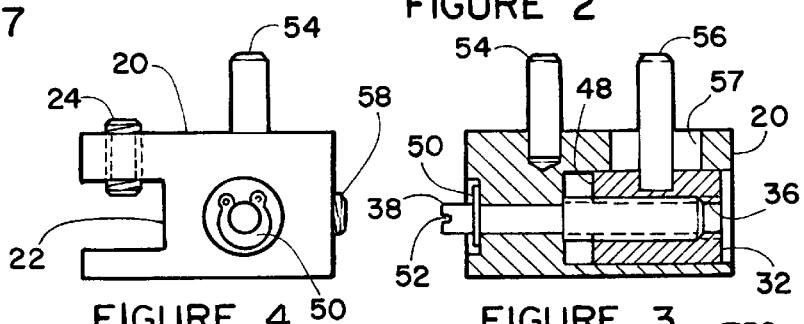
FIG. 3 is a section view taken generally on line 3—3 in FIG. 2.
FIG. 4 is a left side elevation view of the tooling pin assembly.
Figures 5, 6:
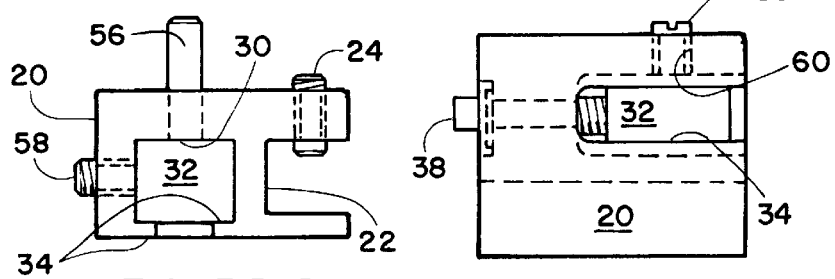
FIG. 5 is a right side elevation view of the tooling pin assembly.
FIG. 6 is view looking upwardly at the underside of the tooling pin assembly.

As seen in FIGS. 1–3, first support body 20 has an elongated channel 30 extending partially across the underside of body 20 holding a block 32 as best seen in FIGS. 5 and 6. A block 32 is slidably positioned in channel 30. If first support body 20 is to be mounted on a flat platen, channel 30 can have a simple U-shape and block 32 can fill the channel, since the open side of the channel will be against the underlying platen. However, if first support body 20 is to be mounted on spaced rails 18 and 19 as seen in FIG. 1, then means for maintaining block 32 within channel 30 is preferred. As best seen in FIGS. 3 and 5, the open side of channel 30 has a pair of inwardly extending lips 34, so that block 32 is within the channel and guided and retained by lips 34. While this arrangement is preferred, any other suitable retaining means, such as keyways in the sides of channel 30, may be used.

Block 32 has a threaded hole 36 parallel to channel 30. A rod 38 (as best seen in FIGS. 3 and 4) has a threaded end portion 40 that engages threaded hole 36. A hole 42 extends through block 32 coaxial with threaded hole 36. An unthreaded portion 44 of rod 38 lies in hole 42 and extends to just beyond the surface of block 30. A shoulder 46 engages the end wall 48 of channel 30. A retaining means such as a conventional clip 50 is snapped into a circumferential recess 51 near the end of rod 38. Shoulder 46 and clip 50 prevent axial movement of rod 38. A screwdriver slot 52 for is provided in the outer end of rod 38. If desired, an Allen wrench socket or any other suitable connection for a tool may be provided in place of slot 52, if desired.

A first pin 54 as seen in FIGS. 1 and 2 is secured to first support body 20. A second pin 56 extending through slot 57 is secured to block 32 and moves herewith. Both pins 54 and 56 have diameters significantly less than the diameter of hole 14, so that PCB 12 can be positioned over closely spaced pins 54 and 56 with room to spare.

As described below, block 32 and second pin 56 can be moved by rotating rod 38 so that the pins 54 and 56 engage opposite sides of hole 14. Once block 32 is positioned, a setscrew 58 extending through a threaded hole may be tightened to lock block 32 in place. Then setscrews 24 can be tightened to lock support bodies 20 and 26 in place along rail 18.

In operation, support bodies 20 and 26 are loosely secured to rail 18 with fixed pin 28 and first and second pins 54 and 56 generally aligned with holes 16 and 14, respectively. The diameter of fixed pin 28 and the combined diameter of pins 54 and 56 preferably is less than 80% of the diameter of the smallest diameter holes to be found on different series of PCB's 12.

PCB 12 is lowered into place with the holes over the pins. Support bodies 20 and 26 are moved apart along rail 18 until pins 28 and 54 engage the outer edges of holes 16 and 14, respectively. Then setscrews 24 are tightened to secure the support bodies to the rail. Next, rod 38 is rotated (as best seen in FIGS. 2 and 3) to move pin 56 into engagement with the edge of hole 14 opposite the edge engaged by pin 54. Then, PCB 12 and a series of identical PCB's may be placed over the pins, operations performed on the PCB's and the PCB's removed. Precise alignment is thus assured through the entire series of PCB's with identical holes 14 and 16. When a different PCB is to be used, rod 38 is rotated to move pin 56 toward pin 54 and setscrews 24 are loosened, allowing readjustment of support bodies 20 and 26 and pin 56 as described above to accommodate tooling holes 14 and 16 that have different spacings and diameters compared to those of the original PCB.

While certain specific relationships, materials and other parameters have been detailed in the above description of preferred embodiments, those can be varied, where suitable, with similar results. Other applications, variation and ramifications of the present invention will occur to those skilled in the art upon reading the present disclosure. Those are intended to be included within the scope of this invention as defined in the appended claims.

I claim:

1. A tooling pin assembly for engaging tooling holes in a object upon which operations are to be performed, each said tooling pin assembly comprising:

a support body;

at least two adjacent tooling pins extending from a surface of said support body;

said tooling pins having diameters less than a predetermined tooling hole diameter;

one tooling pin being fixed to said surface and at least one tooling pin being movable relative to said fixed tooling pin;

locking means for locking each said movable pin in a predetermined position;

whereby a tooling hole may be placed over said at least two adjacent tooling pins and said at least one of said tooling pins can be moved so that all of said tooling pins engage sides of said tooling hole.

2. The tooling pin assembly according to claim 1 wherein each of said movable tooling pins is mounted on a block slidably mounted in a slot in said support body and further including threaded means for moving said block relative to said support body.

3. A tooling pin assembly for engaging tooling holes in a object upon which operations are to be performed, said tooling pin assembly comprising:

a support body;

a first tooling pin secured to a first surface of said support body;

a slot in said first surface adjacent to said first tooling pin having a longitudinal axis that passes through said first tooling pin;

a channel of predetermined length in a second surface of said support body opposite said first surface, said channel extending adjacent to, and communicating with, said slot;

a block slidably positioned in said channel for sliding parallel to said first axis;

a second tooling pin secured to said block and extending through said slot adjacent and generally parallel to said first tooling pin;

said first and second tooling pins having diameters sufficiently less that the predetermined diameter of said tooling holes that both can fit in one of said tooling holes;

means for moving said block along said channel to move second tooling pin toward and away from said first tooling pin;

said means for moving said block comprising:
 a bore generally parallel to said first axis and extending through both said support body at an end of said channel and said block, said bore being unthreaded through said support body and threaded through said block;
 a rod in said bore having a threaded distal end portion for engaging said internal thread and an unthreaded proximal end portion extending through said support member to an outside opening; and
 means at said distal end portion for preventing relative movement between said rod and said support body
said means for preventing relative movement between said rod and said support body comprising a shoulder on said rod for engaging said end of said channel and a radially extending means on said proximal end; and
locking means for locking said block in a predetermined position.

4. The tooling pin assembly according to claim 3 further including means at said proximal end for engaging a tool for rotating said rod.

5. The tooling pin assembly according to claim 3 wherein said locking means comprises a setscrew extending through an opening in said support means into engagement with a side wall of said block.

6. In an assembly for positioning a printed circuit board in a predetermined position which comprises a base for holding a printed circuit board, said board having at least two tooling holes, tooling pin assemblies for engaging each of said tooling holes, the improvement wherein at least some of said tooling pin assembly comprise:

a support body;

a first tooling pin secured to a first surface of said support body;

a slot in said first surface adjacent to said first tooling pin having a longitudinal axis that passes through said first tooling pin;

a channel of predetermined length in a second surface of said support body opposite said first surface, said channel extending adjacent to, and communicating with, said slot;

a block slidably positioned in said channel for sliding parallel to said first axis;

a second tooling pin secured to said block and extending through said slot adjacent and generally parallel to said first tooling pin;

said first and second tooling pins having diameters sufficiently less that the diameter of said tooling holes that both can fit in one of said tooling holes;

means for moving said block along said channel to move second tooling pin toward and away from said first tooling pin;

means for attaching said support body to said base at a predetermined position; and locking means for locking said block in a predetermined position.

7. The improvement according to claim 6 wherein said means for moving said block comprises:

a bore generally parallel to said first axis and extending through both said support body at an end of said channel and said block, said bore being unthreaded through said support body and threaded through said block;

a rod in said bore having a threaded distal end portion for engaging said internal thread and an unthreaded proximal end portion extending through said support member to an outside opening; and means at said distal end portion for preventing relative movement between said rod and said support body.

8. The improvement according to claim 7 wherein said means for preventing relative movement between said rod and said support body comprises a shoulder on said rod for engaging said end of said channel and a radially extending means on said proximal end.

9. The improvement according to claim 8 further including means at said proximal end for engaging a tool for rotating said rod.

10. The improvement according to claim 6 wherein said locking means comprises a setscrew extending through an opening in said support means into engagement with a side wall of said block.

* * * * *